United States Patent
Lee et al.

(10) Patent No.: US 7,202,142 B2
(45) Date of Patent: *Apr. 10, 2007

(54) METHOD FOR PRODUCING LOW DEFECT DENSITY STRAINED -SI CHANNEL MOSFETS

(75) Inventors: Kuen-Chyr Lee, Tainan (TW); Liang-Gi Yao, Hsinchu (TW); Shih-Chang Chen, Hsin-Chu (TW); Mong-Song Liang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/838,721

(22) Filed: May 3, 2004

(65) Prior Publication Data

US 2005/0245035 A1    Nov. 3, 2005

(51) Int. Cl.
    *H01L 21/20* (2006.01)
(52) U.S. Cl. .................... 438/481; 257/E21.09
(58) Field of Classification Search ............ 438/478, 438/481, 503, 507; 117/84, 88
See application file for complete search history.

(56) References Cited

U.S. PATENT DOCUMENTS

| 6,900,115 B2 * | 5/2005 | Todd ................. 438/478 |
| 6,982,208 B2 * | 1/2006 | Lee et al. ............ 438/455 |
| 2004/0238885 A1 * | 12/2004 | Bedell et al. ........... 257/347 |

* cited by examiner

*Primary Examiner*—Scott B. Geyer
(74) *Attorney, Agent, or Firm*—Tung & Associates

(57) ABSTRACT

A silicon strained channel MOSFET device and method for forming the same the method providing improved wafer throughput and low defect density including the steps of providing a silicon substrate; epitaxially growing a first silicon layer using at least one deposition precursor selected from the group consisting of disilane, trisilane, dichlorosilane, and silane; epitaxially growing a step-grade SiGe buffer layer over and contacting the first silicon layer using at least one deposition precursor selected from the group consisting of disilane and trisilane; epitaxially growing a SiGe capping layer over and contacting the step-grade SiGe buffer layer using at least one deposition precursor selected from the group consisting of disilane and trisilane; and, epitaxially growing a second silicon layer using at least one deposition precursor selected from the group consisting of disilane, trisilane, dichlorosilane, and silane.

23 Claims, 3 Drawing Sheets

METHOD FOR PRODUCING LOW DEFECT DENSITY STRAINED -SI CHANNEL MOSFETS

FIELD OF THE INVENTION

This invention generally relates to micro-integrated circuit manufacturing more particularly to epitaxial growth methods for producing strained silicon channel MOSFET devices.

BACKGROUND OF THE INVENTION

An increasingly sought after approach for improving the performance of a metal oxide semiconductor field effect transistor (MOSFET), including a complimentary metal oxide semiconductor (CMOS) device is the introduction of strain induced band modification. Several approaches have been made to produce Strained Si-channel N and P MOSFETS with varying degrees of success.

One approach to producing a strained silicon channel, for example in tensile strain, such as a thin silicon channel layer has been grown over step graded SiGe. One implementation of a tensile strained Si channel is the growth of silicon over a relatively thick SiGe substrate. For example, most approaches for introducing strained silicon regions of the prior art employ complex multi-layer structures, for example relying on relatively thick SiGe buffer layers to achieve tensile stress in the surface silicon channel. Conventional processes such as ultra-high-vacuum chemical vapor deposition (UHV) and molecular Beam Epitaxy (MBE) are low-throughput processes which have been economically prohibitive in applying for high throughput CMOS manufacturing processes. In addition, although more complex devices, such as silicon-on-insulator (SOI) devices have incorporated strained silicon substrates, such devices require complex manufacturing processes which are cost prohibitive and generally incompatible with CMOS manufacturing technology.

In particular, it is important to achieve a low-defect density in the strained silicon layer used for forming the strained silicon channel in a CMOS device. For example, the epitaxially grown silicon layer must be grown a relatively defect-free surface avoiding nucleation of dislocations which can adversely degrade electrical properties. For example, nucleation of dislocations in the strained silicon layer due to propagating strain mismatches in the SiGe layer are undesirable and attempts have been made to reduce the propagation of dislocations by various methods.

Other difficulties related to growing low defect density strained silicon layers are related to the reaction kinetics of the deposition process to epitaxially grown silicon. For example, processes of the prior art have typically used silane and chlorosilane precursors to form epitaxial silicon and SiGe layers. The reaction temperatures typically have been carried out at temperatures greater than about 700° C. to achieve higher deposition rates and improve film uniformity by deposition in the mass transport limited regime. However, due to several factors including the undesirable effects of thermal gradients which contribute to dislocation nucleation, lower temperature epitaxial growth is frequently a preferred process. However, at lower deposition temperatures e.g., less than about 700° C., deposition rates for silane may be as low as 10 nanometers/minute requiring extended deposition times to form a multi-layer strained-Si channel device.

There is therefore a need in the semiconductor processing art to develop improved strained silicon channel MOSFET devices and processing methods for forming the same to produce a low defect density device with improved electrical performance while increasing process wafer throughput.

It is therefore an object of the invention to provide improved strained silicon channel MOSFET devices and processing methods for forming the same to produce a low defect density device with improved electrical performance while increasing process wafer throughput while overcoming other shortcomings and deficiencies of the prior art.

SUMMARY OF THE INVENTION

To achieve the foregoing and other objects, and in accordance with the purposes of the present invention, as embodied and broadly described herein, the present invention provides a silicon strained layer MOSFET device and a method for forming the same, the method providing improved wafer throughput and low defect density.

In a first embodiment, the method includes providing a silicon substrate; epitaxially growing a first silicon layer using at least one deposition precursor selected from the group consisting of disilane, trisilane, dichlorosilane, and silane; epitaxially growing a step-grade SiGe buffer layer over and contacting the first silicon layer using at least one deposition precursor selected from the group consisting of disilane and trisilane; epitaxially growing a SiGe capping layer over and contacting the step-grade SiGe buffer layer using at least one deposition precursor selected from the group consisting of disilane and trisilane; and, epitaxially growing a second silicon layer using at least one deposition precursor selected from the group consisting of disilane, trisilane, dichlorosilane, and silane.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to a particular strained-Si channel MOFSET device, it will be appreciated that the method of the present invention may be applied to the formation of any semiconductor device where a strained silicon channel may be advantageously formed to provide improved electrical properties.

Referring to FIG. 1A–1E, in an exemplary embodiment of the method of the present invention, are shown cross-sectional schematic views of a portion of a semiconductor wafer at stages in production of an exemplary strained-Si channel N-MOFSET device.

Figure 1A:
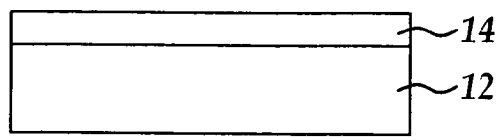
FIG. 1A–1E are cross sectional schematic representations of an exemplary strained Si channel CMOS MOSFET device at stages of manufacture according to an embodiment of the present invention.

Referring to FIG. 1A, a substrate (silicon wafer) 12 formed of single crystalline silicon is provided, for example p-type with a (100) lattice orientation. Prior to subsequent epitaxial growth of an overlying silicon buffer layer, the process wafer is preferably cleaned, including removing native oxides from the process surface by contacting the process surface, for example by dipping, in at least one cleaning solution including $NH_4OH$—$H_2O_2$—$H_2O$, $HCl$—$H_2O_2$—$H_2O$, and HF, followed by a deionized water rinse. The silicon wafer 12 is then preferably spin-dried in an inert gas environment, for example in nitrogen gas. The silicon substrate 12 is optionally further subjected to a HF vapor treatment to suppress oxidation of silicon surface. For example, the HF vapor includes a 50% concentrated HF solution at the saturated vapor pressure.

Still referring to FIG. 1A, according to an embodiment of the present invention, a silicon buffer layer e.g., 14 is then epitaxially grown to a thickness of between about 0.1 microns and 0.9 microns, more preferably between about 0.3 microns and about 0.7 microns. In one embodiment, the silicon buffer layer 14 is formed using at least one, more preferably one of a disilane ($Si_2H_6$) and trisilane ($Si_3H_8$) deposition precursor at a wafer deposition temperature of less than about 700° C. For example, a ultra high vacuum chemical vapor deposition (UHVCVD) multi-wafer reactor or a single wafer UHV rapid thermal chemical vapor deposition (UHV/RTCVD) reactor may be suitably used, for example where a lower base pressure, for example about $10^{-9}$ Torr is first established, followed by introduction the deposition precursor including hydrogen gas to produce a deposition pressure of about $10^{-3}$ Torr.

For example, it has been found that Si or SiGe epitaxial growth using disilane and trisilane precursors, including mixtures thereof, carried out at deposition temperatures from about 550° C. to about 700° C. can advantageously increase silicon deposition rates, for example from about 30 nm/min to about 140 nm/minute to produce low defect density silicon layers. More preferably, the silicon buffer layer is formed by a trisilane precursor since equivalent deposition rates can be achieved at lower temperatures, for example from about 50° C. to about 100° C. lower compared to disilane. For example, using trisilane can increase an epitaxial growth (deposition) rate by greater than about an order of magnitude compared to disilane at deposition temperatures less than about 700° C., for example about 650° C. The increased deposition rates achievable at lower temperature with low defect density by the use of disilane or trisilane, and mixtures thereof advantageously allow an increase in wafer throughput. Lower deposition temperatures are additionally important for carrying out silicon epitaxial deposition in order to reduce temperature gradients and thermal stresses induced across the wafer surface to reduce slip generation within the epitaxial layer.

Figure 2A:
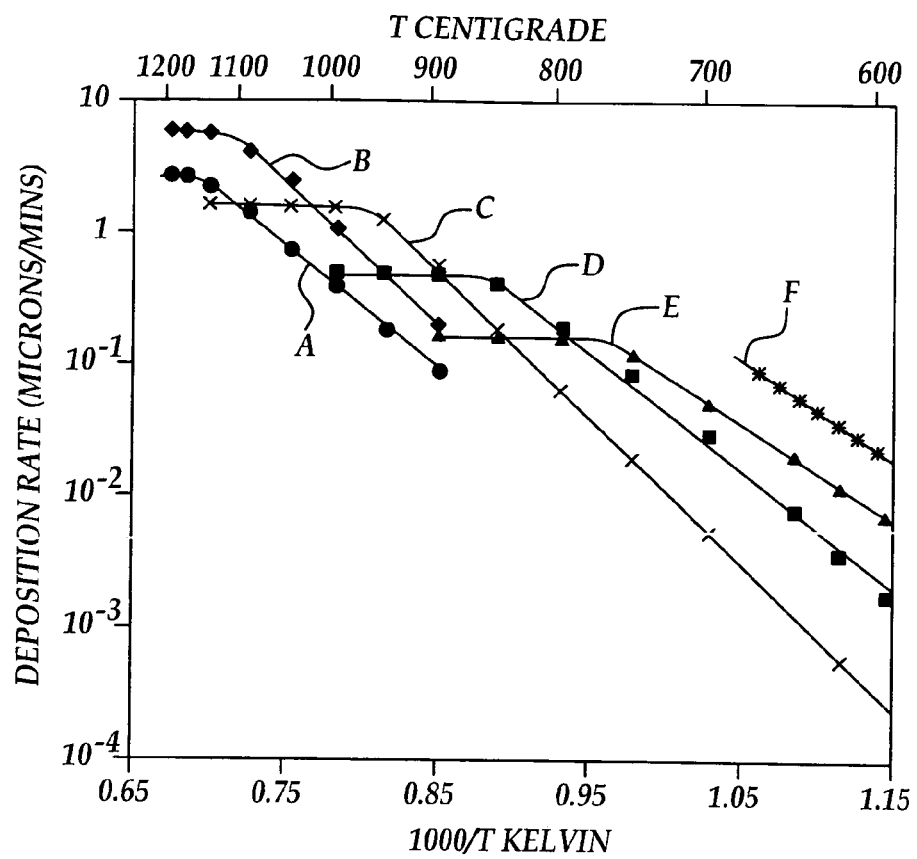
FIG. 2A is a collection of Arrhenius plots of deposition rates achieved according to preferred precursors of the present invention compared to alternative precursors.

For example, referring to FIG. 2A are shown deposition rates presented as a function of inverse temperature in an Arrhenius type plot. Shown are lines fitted to data representing the deposition rate (epitaxial growth rate) in microns/min for $SiCl_4$ (line A), $SiHCl_3$ (line B), $SiH_2Cl_2$ (line C), $SiH_4$ (line D), $Si_2H_6$ (Line E) and $Si_3H_8$ (line F).

The preferred precursors according to the present invention disilane ($Si_2H_6$) and trisilane ($Si_3H_8$) show a higher deposition rate at the preferred deposition temperatures less than about 700° C. compared to alternative precursors. It is noted that only a portion of the trisilane Arrhenius plot is shown based on available actual and extrapolated data.

In an alternative embodiment, optionally at least one of silane ($SiH_4$) and dichlorosilane ($SiH_2Cl_2$) is used as a source precursor for epitaxially growing silicon buffer layer 14 at a process wafer deposition temperature of less than about 700° C., preferably between about 550° C. to about 700° C. Although the deposition rate at a given deposition temperature is significantly slower than using disilane or trisilane, it has been found that offsetting advantages are realized in providing an improved seed layer with lower defect density (e.g., dislocations and stacking faults) to reduce dislocation propagation in an overlying deposited step grade SiGe buffer layer. As a result, strain-relieving glide of dislocations in an overlying step graded SiGe buffer layer is facilitated allowing the formation of a thinner relaxed SiGe capping layer, for example between about 500 and about 900 Angstroms, to achieve full relaxation. The SiGe buffer and capping layers as explained below are preferably deposited using at least one of disilane and trisilane precursors as explained below, thereby still realizing an overall increase in wafer throughput.

Figure 1B:
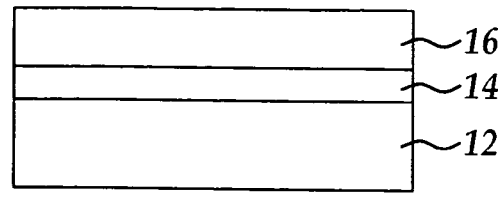

Referring to FIG. 1B, following deposition of the silicon buffer layer 14, a step graded SiGe buffer layer 16 is formed at a thickness of between about 2 microns and about 5 microns. The step graded SiGe buffer layer 16, represented by the formulation $Si_{1-x}Ge_x$ is formed where the Ge compositional ratio X is increased stepwise from about 0 to Y where Y is preferably between about 0.1 and about 0.3. The X value is preferably increased stepwise from a value close to 0 in a lower portion of the buffer layer 16, depending on the number of deposition steps, to a value of between about 0.1 and about 0.3 in an upper portion of the buffer layer in a sequential series of deposition steps. In a most preferred embodiment, X is about 0.2 in an uppermost portion of the step graded SiGe buffer layer 16.

For example, in one embodiment, the SiGe buffer layer is grown in about 2 to about 7 sequential deposition steps where the Ge compositional ratio X is sequentially increased in each deposition step. For example, X is increased sequentially according to a predetermined relationship between SiGe buffer thickness and X as well as the number of deposition steps. For example, each deposition step at a value X may be related to an increase in buffer layer thickness (T) by a linear or non-linear relationship. Exemplary non-linear relationships include, for example, a power law (e.g., $X=aT^{\alpha}$) where a and $\alpha$ are variables or a saturating exponential (e.g., $X=\beta \exp(1-\alpha T)$) where $\alpha$ and $\beta$ are variables. Preferably, the SiGe buffer layer 16 is formed using at least one of disilane and trisilane precursors, more preferably a trisilane precursor and additionally including the precursor source gases germane ($GeH_4$) and $H_2$ carrier gas. The SiGe buffer layer 16 is preferably grown at a process wafer deposition temperature of less than about 700° C., preferably between about 550° C. to about 700° C., most preferably between about 625° C. and about 675° C.

Figure 1C:
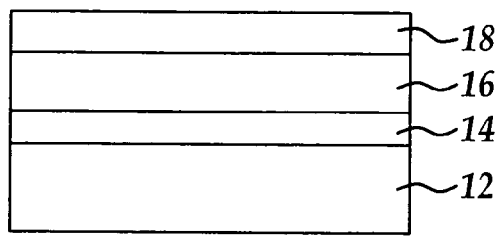

Referring to FIG. 1C, following formation of the step graded SiGe buffer layer 16, a relaxed SiGe capping layer 18 is epitaxially grown at a thickness of about ¼ to about ½ of the thickness of the step graded SiGe buffer layer 16, preferably between about 0.5 microns and about 0.9 microns. The relaxed SiGe capping layer is formed at a composition of $Si_{1-x}Ge_x$ where the Ge composition ratio X is about equal to the Ge compositional ratio in the uppermost portion of the step graded SiGe buffer layer 16. Preferably, the relaxed SiGe capping layer 18 is formed using at least one of disilane and trisilane precursors according to preferred embodiments for depositing the SiGe buffer layer 14 including the precursor source gases germane (GeH$_4$) and H$_2$ carrier gas. The relaxed SiGe capping layer 18 is preferably grown at a process wafer deposition temperature of less than about 700° C., preferably between about 550° C. to about 700° C., most preferably between about 625° C. and about 675° C.

Figure 1D:
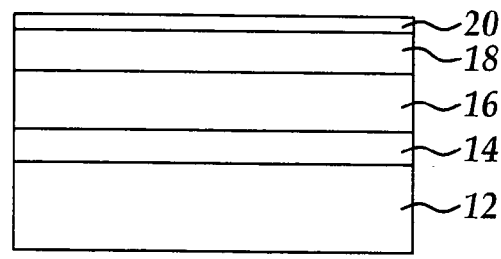

Referring to FIG. 1D, following formation of the relaxed SiGe capping layer 18, a strained Si layer 20 is epitaxially grown over the relaxed SiGe capping layer 18 using at least one of disilane and trisilane at a temperature of from between about 550° C. to about 700° C., most preferably between about 625° C. and about 675° C. More preferably, in an alternative embodiment, the strained Si layer 20 is formed using at least one of silane and dichlorosilane as source precursors for the same reasons detailed above with respect to the embodiment discussed for formation of the silicon buffer layer 14 using at least one of silane and dichlorosilane as source precursors.

Although the silicon buffer layer 14 and the strained Si layer 20 may be formed at a higher deposition rate using at least one of disilane and trisilane precursors, the use of at least one of silane and dichlorosilane as source precursors for the Si strained layer 20 is preferred due to an ability to achieve a lower defect density, for example from about $10^3$ to about $10^4$ defects/cm$^2$ (e.g., dislocations and stacking faults) in the Si strained layer 20. The Si strained layer 20 is preferably grown at a thickness of between about 0.1 and about 0.3 microns. Moreover, together with other preferred epitaxial depositions, a wafer throughput for the overall strained Si channel formation process is significantly increased, for example achieving reduced process cycle times by a factor of about 4 to about 10.

Figure 1E:
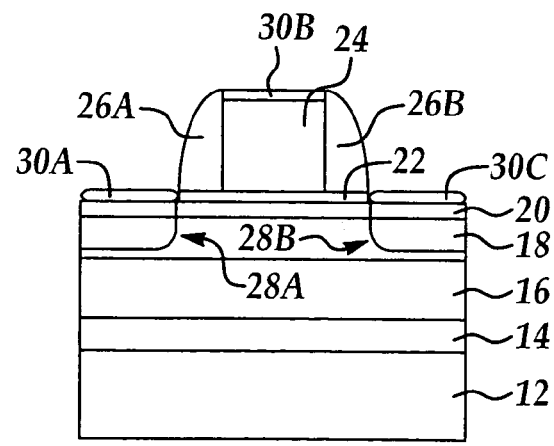

Referring to FIG. 1E, the strained silicon MOSFET, for example an N-type MOSFET is then completed by conventional processes. For example, a gate oxide layer 22 of from about 30 Angstroms to about 120 Angstroms is grown over the strained silicon layer 20 by conventional processes, followed by deposition of a polysilicon layer and subsequent patterning and etching to form a polysilicon gate electrode 24 which is preferably doped, for example P+ doped. Subsequently, source/drain extensions and halo implants are formed by conventional methods in the strained silicon layer 20 (not shown) followed by sidewall spacer formation e.g., 26A and 26B. Conventional ion implantation methods are then carried out to form doped, for example N+, source and drain regions, e.g., 28A and 28B followed by activation annealing. Finally salicides, e.g., 30A, 30B, and 30C, for example Co salicides are formed over contact regions including the source and drain regions and the upper portion of the polysilicon gate electrode.

Figure 2B:
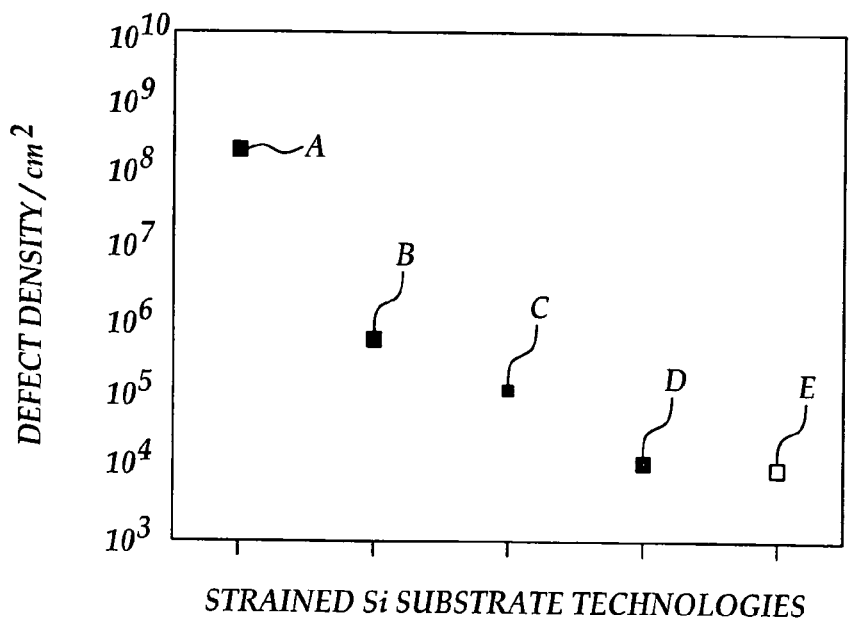
FIG. 2B is representative data comparing Si-strained layer defect density achieved according to embodiments of the present invention compared to processes of the prior art.

Thus, according to embodiments of the present invention, a method for growing a strained Si layer device with higher wafer throughput and low defect density with improved electrical properties has been presented. For example, referring to FIG. 2B, is shown a plot of exemplary defect densities on the vertical axis and a particular approach for forming strained Si layers over a SiGe layer on the horizontal axis. Approach A shows reported defect densities for a strained Si layer formed over a graded SiGe buffer layer according to molecular beam epitaxy (MBE). Approach B reflects reported values using a CVD method for forming a graded SiGe buffer layer. Approach C reflects the results using a SiGe buffer layer formed over an insulator according to an SOI device. Approach D reflects the use of CMP to optimize the SiGe Buffer layer prior to Si deposition. Approach E reflects defect densities realized by depositing the strained Si layer over a SiGe relaxed capping layer formed over a SiGe graded buffer layer according to embodiments of the present invention.

Figure 2C:
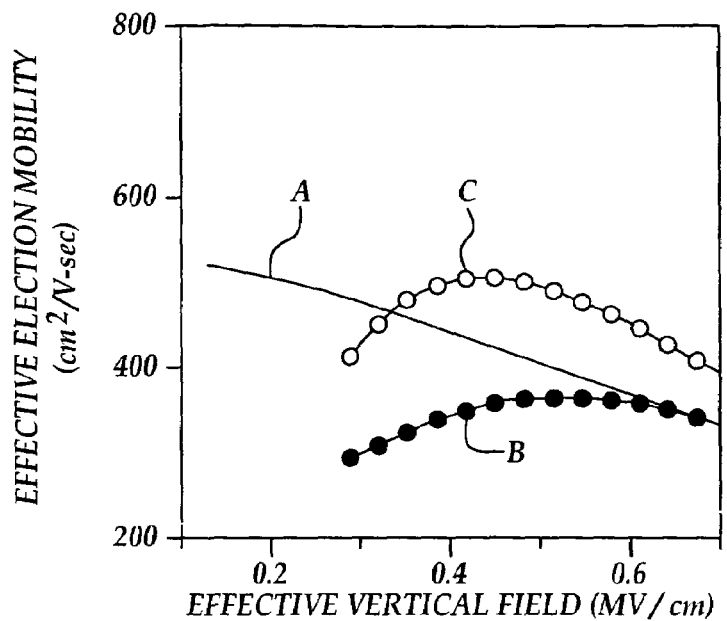
FIG. 2C is representative data showing increased electron mobilities achieved in producing an N-type MOSFET device according to an embodiment of the present invention.

Referring to FIG. 2C is shown effective electron mobility (cm$^2$/V-sec) on the vertical axis and effective applied vertical electric field (MV/cm) on the horizontal axis for N MOFSET devices formed according to embodiments of the invention. Line A represents electron mobility according to the universal mobility model while line B represents bulk Si electron mobility. Line C represents the electron mobility in strained Si layer devices formed according to embodiments of the present invention, correlating to an enhancement in drive current of about 35%.

Figure 3:
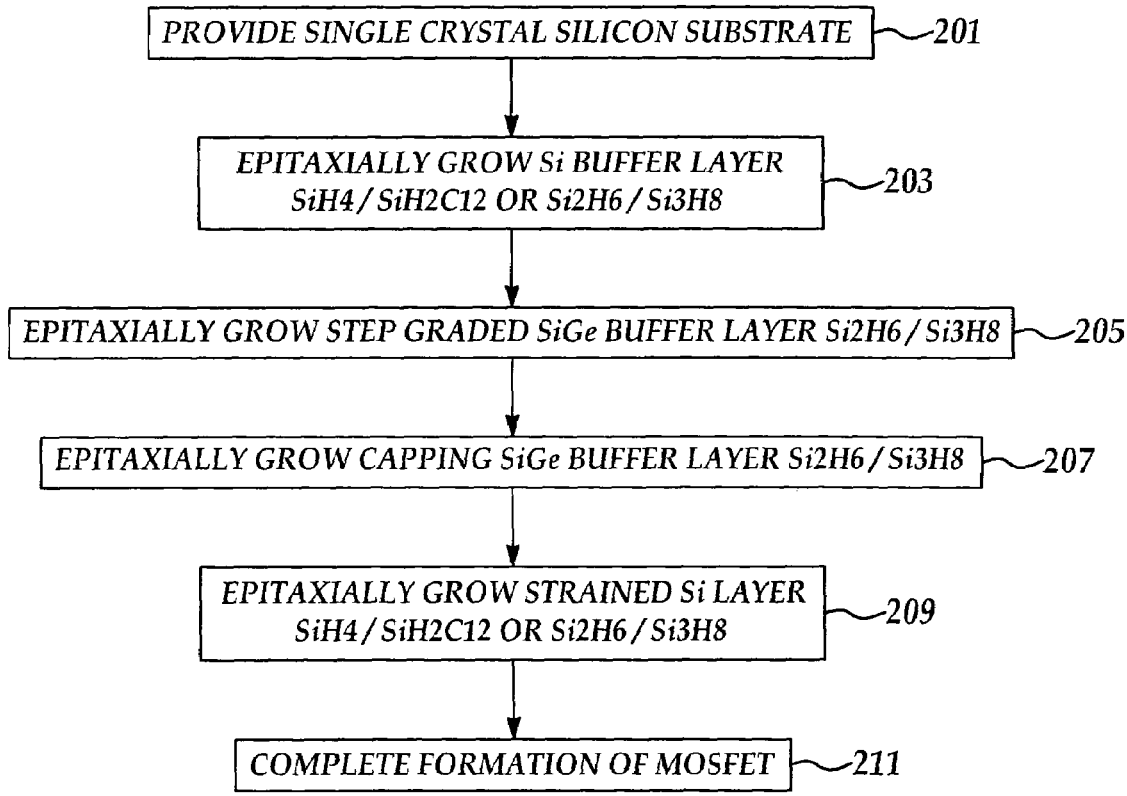
FIG. 3 is an exemplary process flow diagram including several embodiments of the present invention.

Referring to FIG. 3 is a process flow diagram including several embodiments of the present invention. In process 201 a single crystalline substrate having a (100) orientation is provided and cleaned according to preferred embodiments. In process 203, a silicon buffer layer is deposited using either one of disilane and trisilane precursors or using one of silane and dichlorosilane precursors according to preferred embodiments. In process 205, a step grade SiGe buffer layer is deposited according to preferred embodiments using one of disilane and trisilane. In process 207, a fully relaxed SiGe capping layer is deposited according to preferred embodiments using one of disilane and trisilane. In process 209, a silicon strained layer is deposited using either one of disilane and trisilane or using one of silane and dichlorosilane according to preferred embodiments. In process 211, conventional subsequent processes are carried out to form a MOFSET device.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a strained silicon layer device with improved wafer throughput and low defect density comprising the steps of:
   providing a silicon substrate;
   epitaxially growing a first silicon layer using at least one deposition precursor selected from the group consisting of disilane, trisilane, dichlorosilane, and silane;
   epitaxially growing a step-grade SiGe buffer layer over and contacting the first silicon layer using at least one deposition precursor selected from the group consisting of disilane and trisilane;
   epitaxially growing a SiGe capping layer over and contacting the step-grade SiGe buffer layer using at least one deposition precursor selected from the group consisting of disilane and trisilane;
   epitaxially growing a second silicon layer using at least one deposition precursor selected from the group consisting of disilane, trisilane, dichlorosilane, and silane; and
   forming a gate oxide and polysilicon gate electrode over the second silicon layer.

2. The method of claim 1, wherein the second silicon layer is formed in tensile stress.

3. The method of claim 1, wherein at least one of the first silicon layer and second silicon layer are formed using at least one deposition precursor selected from the group consisting of dichiorosilane and silane.

4. The method of claim 1, wherein each step of epitaxial growing is carried out at a deposition temperature between about 550° C. and about 700° C.

5. The method of claim 1, wherein the step-graded SiGe buffer layer and the SiGe capping layer are formed at a deposition temperature between about 625° C. and about 675° C.

6. The method of claim 1, wherein at least one of the step-graded SiGe buffer layer and the SiGe capping layer are formed using a trisilane precursor.

7. The method of claim 1, wherein the step-graded SiGe buffer layer and the SiGe capping layer are formed using one of a disilane and trisilane precursor.

8. The method of claim 1, wherein the first silicon layer, the step-graded SiGe buffer layer and the SiGe capping layer and the second silicon layer are formed using one of a disilane and trisilane precursors.

9. The method of claim 1, wherein the first silicon layer, the step-graded SiGe buffer layer and the SiGe capping layer and the second silicon layer are formed using a trisilane precursor.

10. The method of claim 1, wherein the step graded SiGe layer comprises a compositional percentage of Ge increasing from about 0 percent at a bottom portion to about 10 percent to about 30 percent at an uppermost portion.

11. The method of claim 10, wherein the compositional percentage of Ge increases according to at least one of a linear and non-linear relationship with respect to the step graded SiGe layer thickness.

12. The method of claim 1, further comprising forming source and drain regions to complete the formation of a MOSFET device.

13. The method of claim 1, wherein the first silicon layer is from about 0.1 microns to about 0.9 microns thick.

14. The method of claim 1, wherein the step graded SiGe buffer layer is from about 2 microns to about 5 microns thick.

15. The method of claim 1, wherein the SiGe tapping layer is from about 0.5 microns to about 0.9 microns thick.

16. The method of claim 1, wherein the second silicon layer is from about 0.1 microns to about 0.3 microns thick.

17. A method for forming a strained silicon layer MOFSET device, with increased epitaxial layer growth rates and low defect density comprising the steps of:

providing a silicon substrate;

epitaxially growing according to a CVD process a first silicon layer using at least one deposition precursor selected from the group consisting of dichlorosilane and silane;

epitaxially growing according to a CVD process a step-grade SiGe buffer layer over and contacting the first silicon layer using at least one deposition precursor selected from the group consisting of disilane and trisilane;

epitaxially growing according to a CVD process a SiGe capping layer over and contacting the step-grade SiGe buffer layer using at least one deposition precursor selected from the group consisting of disilane and trisilane;

epitaxially growing according to a CVD process a second silicon layer over and contacting the SiGe capping layer using at least one deposition precursor selected from the group consisting of dichiorosilane, and silane; and forming source and drain regions to complete a MOSFET device.

18. The method of claim 17, wherein each step of epitaxial growing is carried out at a deposition temperature between about 550° C. and about 700° C.

19. The method of claim 17, wherein at least one of the step-graded SiGe buffer layer and the SiGe capping layer are formed using primarily a trisilane precursor.

20. The method of claim 17, wherein the step-graded SiGe buffer layer and the SiGe capping layer are formed using one of a disilane and trisilane precursor.

21. The method of claim 17, wherein the step graded SiGe layer comprises a compositional percentage of Ge increasing from about 0 percent at a bottom portion to about 10 percent to about 30 percent at an uppermost portion.

22. The method of claim 21, wherein the compositional percentage of Ge increases according to at least one of a linear and non-linear relationship with respect to the step graded SiGe layer thickness.

23. The method of claim 17, further comprising forming a gate oxide and polysilicon gate electrode over the second silicon layer.

* * * * *